United States Patent
Shih et al.

(10) Patent No.: US 7,413,976 B2
(45) Date of Patent: Aug. 19, 2008

(54) UNIFORM PASSIVATION METHOD FOR CONDUCTIVE FEATURES

(75) Inventors: Chien-Hsueh Shih, Taipei (TW); Hung-Wen Su, Jhubei (TW); Minghsing Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 321 days.

(21) Appl. No.: 11/047,836

(22) Filed: Feb. 1, 2005

(65) Prior Publication Data

US 2006/0172529 A1 Aug. 3, 2006

(51) Int. Cl.
*H01L 21/4763* (2006.01)

(52) U.S. Cl. .................. 438/637; 438/694; 438/754; 257/758

(58) Field of Classification Search .......... 438/637, 438/694, 754; 257/758
See application file for complete search history.

(56) References Cited

U.S. PATENT DOCUMENTS

| 6,251,710 B1 * | 6/2001 | Radens et al. .............. 438/131 |
| 6,277,450 B1 * | 8/2001 | Katoot et al. .............. 427/512 |
| 6,774,051 B2 * | 8/2004 | Chung et al. .............. 438/778 |
| 2006/0141156 A1 * | 6/2006 | Viel et al. .................. 427/258 |

\* cited by examiner

*Primary Examiner*—Carl Whitehead, Jr.
*Assistant Examiner*—Colleen E Rodgers
(74) *Attorney, Agent, or Firm*—Slater & Matsil, L.L.P.

(57) ABSTRACT

The top surfaces of conductive features are treated with a treatment solution before forming a passivation layer over the conductive features. The treatment solution includes a cleaning solution and a chemical grafting precursor. The treatment solution may also include a leveling and wetting agent to improve coverage uniformity of the chemical grafting precursor. The method results in a uniform passivation layer formed over conductive features across a surface of a workpiece.

30 Claims, 3 Drawing Sheets

UNIFORM PASSIVATION METHOD FOR CONDUCTIVE FEATURES

TECHNICAL FIELD

The present invention relates generally to semiconductor devices, and more particularly to methods of passivating metallization structures.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

As technology has progressed, the demand for smaller semiconductor devices with improved performance has increased. A move is being made away from the traditional materials used in the past in semiconductor device designs, to meet these demands. For example, in the past, aluminum and aluminum alloys were most often used as a conductive material for conductive lines and vias in metallization structures, and silicon dioxide was used as an insulator between conductive lines and vias. However, as semiconductor devices have been scaled down in size, conductive features made from these materials have exhibited an increase in propagation delay.

For example, as minimum feature size decreases, RC time delay begins to limit the propagation delay of integrated circuits. RC time delay refers to the product of the metal resistance (R) and the dielectric capacitance (C). To reduce the RC time delay, low dielectric constant materials are being used as insulating materials, and there is a switch being made to the use of copper for interconnect materials, rather than aluminum.

One advantage of switching from aluminum to copper for semiconductor device interconnects is increased speed. Because the use of copper decreases the RC time delay due to the decreased resistivity of copper, devices can operate faster. There are also other advantages of switching to copper interconnects. For example, copper has a lower resistivity and increased electromigration resistance compared to aluminum. The reduced resistivity of copper results in the ability to manufacture thinner conductive lines, reducing the sidewall capacitance of the conductive lines. Also, because copper has improved electromigration resistance, higher current densities may be used.

RC time delays for interconnects can severely limit microprocessor clock speed. This limitation can be overcome by switching from aluminum to copper, and can be further improved by the use of copper in conjunction with low-k dielectric materials. Combining copper interconnects with low-k dielectric materials increases interconnect speed by reducing the RC time delay, for example.

However, there are some challenges in using copper for an interconnect material. For example, copper oxidizes at a relatively low temperature compared to aluminum, and the oxide formed on copper is not a high quality oxide, as is aluminum oxide. Copper does not form a self-passivating oxide on its surface, as aluminum does. Rather, portions of the copper interconnect remain exposed and are thus more susceptible to corrosion. It is difficult to directly etch copper, e.g., in a subtractive etch process, and thus, copper interconnects are often formed using damascene processes rather than by direct etching. A damascene process is one in which a dielectric material is deposited on a wafer, and then the dielectric material is patterned with the conductive line pattern. The conductive line pattern typically comprises a plurality of trenches, for example. The trenches are then filled in with conductive material, and a chemical-mechanical polish (CMP) process is used to remove the excess conductive material from the top surface of the dielectric material. The conductive material remaining within the dielectric material comprises the conductive lines.

Damascene processes are typically either single or dual damascene. In a single damascene process, one metal layer is formed at a time. For example, the insulating layer is patterned and then filled with metal, and a CMP process is used to form a single metal layer. In a dual damascene process, two adjacent horizontal insulating layers are patterned, e.g., using two lithography patterns in the two insulating layers or a single insulating layer that are filled with metal, and a CMP process is used to remove excess conductive material and form patterned conductive material in the insulating layers. For example, the patterns may comprise conductive lines in one insulating layer portion, and vias in the underlying insulating layer portion. The vias may connect the conductive lines to devices or interconnect layers that reside in the underlying insulating layer. Thus, in a dual damascene process, conductor and via trenches are filled in one fill step.

Because copper oxidizes easily, it may be desirable to treat the top surface of copper conductive lines, e.g., with a passivation layer. However, it can be challenging to form a passivation layer that is uniform over the entire surface of a semiconductor workpiece.

Thus, what are needed in the art are improved methods of forming passivation layers over conductive features of semiconductor devices.

SUMMARY OF THE INVENTION

These and other problems are generally solved or circumvented, and technical advantages are generally achieved, by preferred embodiments of the present invention, which provide novel methods of passivating conductive features of semiconductor devices. Conductive features are treated with a novel treatment solution to improve the adhesive properties of the top surface of the conductive features, and improve selectivity of the passivation layer formation. The passivation layer formed is uniform, even, and completely covers the conductive features over the entire surface of a workpiece or individual die, for example.

In accordance with a preferred embodiment of the present invention, a method of treating a semiconductor device having at least one conductive feature formed thereon, before forming a passivation layer over the at least one conductive feature, includes treating a top surface of the at least one conductive feature with a treatment solution. The treatment solution comprises a cleaning solution and a chemical grafting precursor.

In accordance with another preferred embodiment of the present invention, a method of manufacturing a semiconductor device includes providing a workpiece, forming at least one conductive feature over the workpiece, and treating at least a top surface of the at least one conductive feature with a treatment solution, the treatment solution comprising a cleaning solution and a chemical grafting precursor. A passivation layer is formed over the at least one conductive feature.

Advantages of preferred embodiments of the present invention include providing novel methods of forming passivation layers that are formed evenly and uniformly over conductive features across a surface of a semiconductor workpiece. The passivation layers may be formed before or after a CMP process, on conductive features formed by a damascene process or a subtractive etch process. A novel treatment solution is used to treat at least the top surface of the conductive features. The treatment solution improves the adhesive properties of the conductive features, provides improved selectivity between the conductive features and the insulating layer, and causes the formation of a uniform passivation layer across the surface of a semiconductor workpiece.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
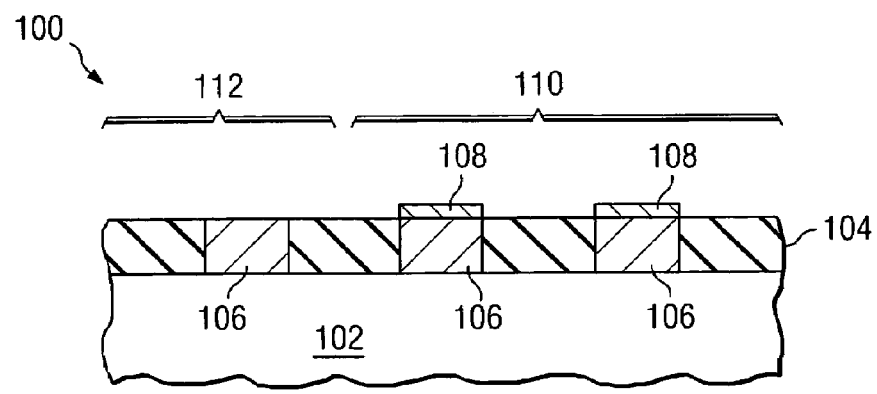
FIG. 1 is a cross-sectional view of a less preferred embodiment of the present invention, wherein a semiconductor device exhibits de-wetting problems when a passivation layer is formed on conductive features.

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device having conductive features such as conductive lines and/or vias comprised of copper and/or copper alloys. The invention may also be applied, however, to semiconductor devices having conductive features comprised of other conductive materials, such as aluminum, aluminum alloys, tungsten, tungsten alloys, or other materials, as examples.

A less preferred embodiment of the present invention will first be described, with reference to FIGS. 1 and 2. A semiconductor device 100 that has been treated with a passivation layer 108 comprising a passivating material such as CoWP is shown in a cross-sectional view in FIG. 1, and in a top view in FIG. 2.

A problem with the passivation layer 108 shown is that the CoWP does not cover every conductive feature 106 evenly, as intended. For example, in FIG. 1, some conductive features 106 are covered with the passivation layer 108, e.g., in region 110, but other conductive features 106 are not covered with the passivation layer 108, as shown in region 112. Conductive features 106 at the edges of a die may not be covered with the passivation layer 108, for example, because of uneven coverage or de-wetting of the passivation layer 108 material. FIG. 2 shows a top view of a semiconductor wafer or workpiece 102. Entire or partial individual die in region 114, e.g., at the edges and/or corners of the wafer 102, may not be coated with the passivation layer 108, as in other regions 116 of the wafer 102, for example.

Figure 2:
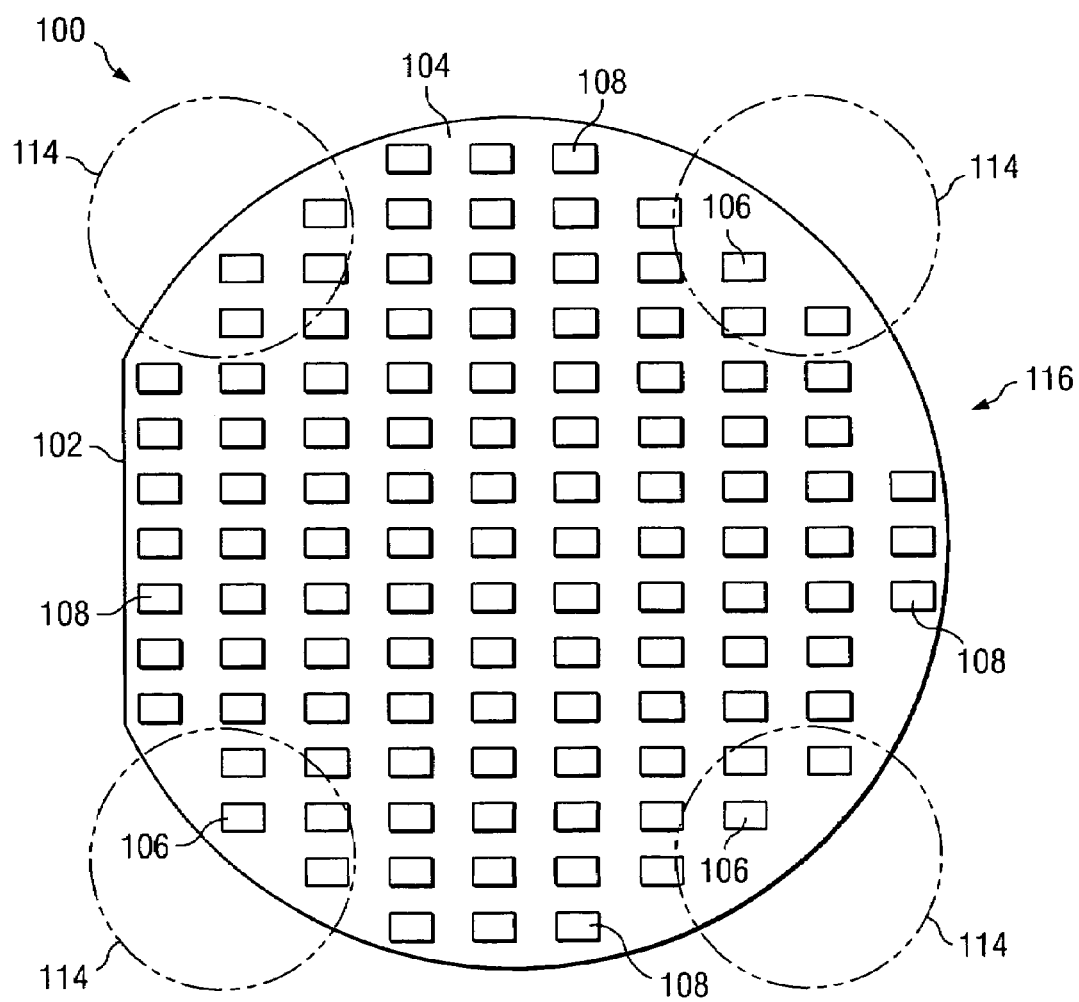
FIG. 2 is a top view of the semiconductor wafer shown in FIG. 1, illustrating the de-wetting problems that can occur when forming passivation layers on conductive features at the edge regions of a semiconductor workpiece.

In the semiconductor device 100 shown in FIGS. 1 and 2, the passivation layer 108 is formed by forming a layer of CoWP after a CMP process to form the conductive lines 106 in a damascene method. The workpiece 102 may be pre-cleaned prior to forming the passivation layer 108, using a low acid solution, such as a solution of a low concentration of $H_2SO_4$ or citric acid, as examples. After the CMP process, if the conductive lines 106 are exposed to air, a thin layer of oxide may form over the conductive lines 106, which may prevent the passivation layer 108 from forming on the conductive lines 106. The pre-cleaning step removes the copper oxide that may have formed on the top surface of the conductive lines 106 during or after the CMP process, for example.

The passivation layer 108 is typically formed by dipping the dry wafer or workpiece 102 into a bath or by a chemical spray, as examples. However, the top surface of the conductive features 106 may not have good adhesive properties, resulting in non-uniformity of the passivation layer 108 formed across the top surface of the workpiece 102. The conductive lines of die at the edges or corners of a workpiece may have more of the insulating layer 104 exposed, for example, preventing conductive lines 106 in those regions 114 from wetting with the passivation layer 108 material, as shown in a top view in FIG. 2. Thus, the passivation layer 108 is not uniform and may be thicker in some regions and thinner in other regions, and there may be no passivation layer 108 formed at all in some regions 114 of the workpiece 102, as shown in FIG. 2.

Increasing the thickness of the passivation layer 108 in order to attempt to improve the coverage is undesirable, because the effective conductive line thickness is increased, which can increase the resistance. Changing the chemistry of the passivation layer 108 deposition process is also undesirable, because process changes would be introduced that could change the material of the passivation layer 108, for example. For example, the passivation layer 108 may be formed by a selective deposition process, e.g., by selectively forming the passivation layer 108 on the conductive lines 106 but not on the insulating layer 104. Changing the chemistry of the passivation layer 108 deposition process may result in the loss of the selectivity in the deposition process, for example.

Thus, what are needed are methods of forming passivation layers over conductive features of semiconductor devices that provide even, uniform coverage on conductive features across the entire surface of a workpiece.

Embodiments of the present invention achieve technical advantages by providing a method of forming a passivation layer that evenly coats conductive features of a workpiece and exhibits a reduced amount of de-wetting, or exhibits no de-wetting problems. Either before or after a CMP process, the top surface of a workpiece (e.g., having exposed conductive features) is cleaned with a novel treatment solution before the passivation layer is formed. The treatment solution prepares the top surface of the conductive features, improving the adhesive properties and making the passivation layer form more uniformly over the conductive features. The resulting uniform passivation layer protects the conductive lines from oxidation. The treatment solution prepares the top surface of the conductive lines and improves the uniformity in coverage of the passivation layer.

Figure 3:
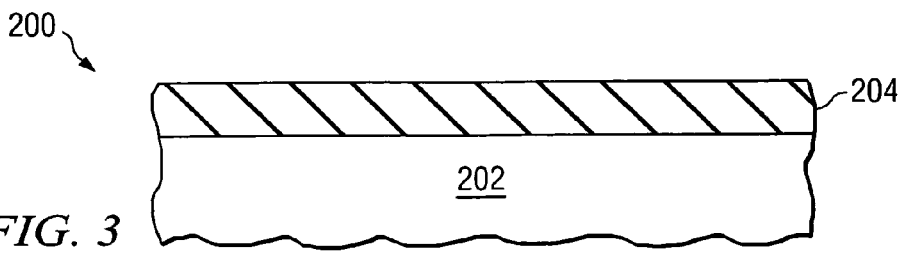
FIGS. 3 through 7 show cross-sectional views of a preferred embodiment of the present invention, wherein a passivation layer is formed over conductive features formed in a damascene process.

FIGS. 3 through 7 show cross-sectional views of a preferred embodiment of the present invention at various stages of manufacturing. With reference now to FIG. 3, there is shown a semiconductor device 200 in a cross-sectional view including a workpiece 202. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate.

An insulating layer 204 is formed over the workpiece. The insulating layer 204 may comprise a low dielectric constant (k) material, having a dielectric constant of about 3.5 or lower, in one embodiment. Alternatively, the insulating layer 204 may comprise a dielectric constant of about 3.5 or greater, in another embodiment, for example. The insulating layer 204 may comprise $SiO_2$, SiON, or fluorinated silicon glass (FSG), as examples, although the insulating layer 204 may alternatively comprise other materials. The insulating layer 204 may comprise a thickness of about 5000 Angstroms or less, and in one embodiment, preferably comprises a thickness of about 2000 to about 4000 Angstroms, for example, although the insulating layer 204 may alternatively comprise other thicknesses. The insulating layer 204 may be deposited by chemical vapor deposition (CVD) or by a spin-on process, as examples, although alternatively, the insulating layer 204 may be formed using other methods.

Figure 4:
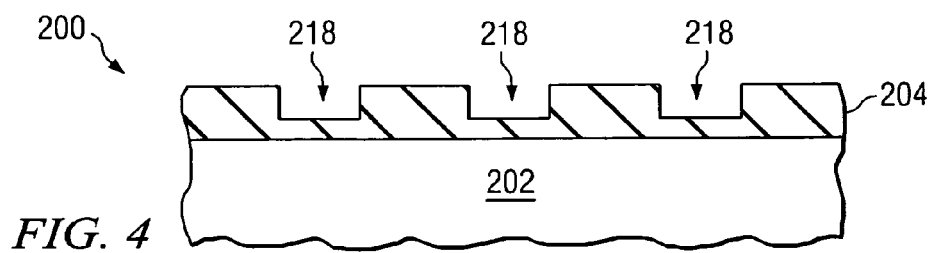

The insulating layer 204 may then be patterned as shown in FIG. 4, e.g., by depositing a photoresist (not shown in the figures), patterning the photoresist, and using the photoresist as a mask while exposed portions of the insulating layer 204 are etched away. The photoresist is then removed. Alternatively, the insulating layer 204 may be directly etched, using ion beam lithography (IBL) or other direct etching technique, for example. The insulating layer 204 may be patterned using a single damascene process, as shown, or alternatively, the insulating layer 204 may be patterned using a dual damascene process, not shown. The trenches 218 formed in the insulating layer 204 may extend partially (as shown) or fully through the insulating layer 204 (not shown in FIG. 4; see conductive features 206' formed in insulating layer 204' in FIG. 9), for example.

Figure 5:
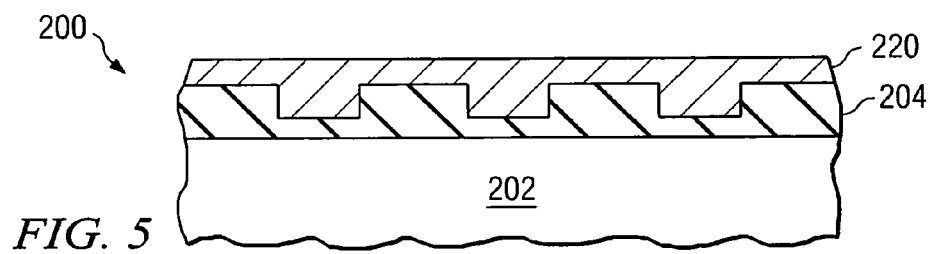

A conductive material 220 is formed over the insulating layer 204, as shown in FIG. 5. The conductive material 220 preferably comprises copper in one embodiment. For example, the conductive material 220 may comprise pure copper or a copper alloy. The conductive material 220 may also comprise other conductive materials, such as aluminum, aluminum alloys, tungsten, tungsten alloys, or other conductive materials, as examples. The conductive material 220 may be formed using electroplating, electro-less deposition, physical vapor deposition (PVD), or CVD, as examples, although alternatively, other deposition methods may be used to form the conductive material 220. The conductive material 220 may include a liner formed over the patterned insulating layer 204, not shown.

Figure 6:
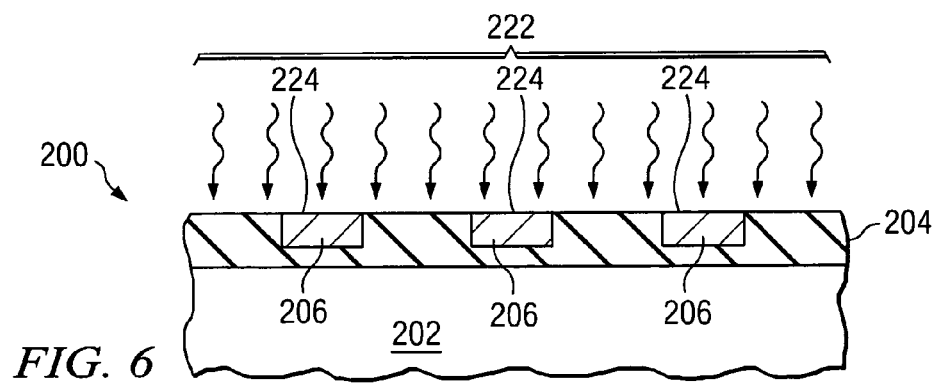
Figure 7:
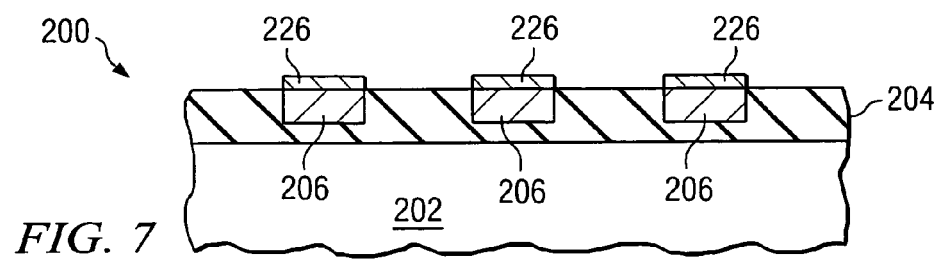

In this embodiment, the workpiece 202 is exposed to a CMP process to remove the excess conductive material 220 from over top surface of the insulating layer 204 and to form conductive features 206 formed in the insulating layer 204, as shown in FIG. 6. For example, the workpiece 202 may be polished using a polishing pad with a slurry or using a dry process. The conductive features 206 may comprise conductive lines or conductive vias, as examples.

Next, the top surfaces of the conductive features 206 and the insulating layer 204 are treated with a treatment solution 222 in accordance with an embodiment of the present invention, as shown in FIG. 6. The treatment solution 222 preferably comprises a chemical that improves the adhesiveness of the top surface 224 of the conductive features 206, yet does not damage or deleteriously affect the top surface of the insulating layer 204, for example. The treatment solution 222 preferably comprises a cleaning solution combined with a chemical grafting precursor, and an optional leveling and wetting agent.

The cleaning solution of the treatment solution 222 preferably comprises a pre-rinse chemical comprising a low acid solution or a low concentration of acid. For example, the cleaning solution may comprise about 0.01 to 0.1% in weight of $H_2SO_4$. The cleaning solution of the treatment solution 222 may also comprise other acids, such as citric acid in a low concentration, e.g., about 0.01 to 0.1% in weight of citric acid. The remainder of the cleaning solution preferably comprises $H_2O$ or other solvents, such as ethanol or acetone, as examples, although alternatively, the remainder of the cleaning solution may comprise other chemicals.

The chemical grafting precursor of the treatment solution 222 preferably comprises vinyl pyridine, and alternatively may comprise phenyldiazonium salts, aryl bromides, or alkylenes, as examples, although other grafting precursors may also be used. The chemical grafting precursor of the treatment solution 222 is preferably adapted to recondition the top surfaces of 224 of the conductive features 206 and the top surface of the insulating layer 204, resulting in improved passivation layer 226 (see FIG. 7) formation selectivity on the conductive features 206, but not the insulating layer 204. The chemical grafting precursor of the treatment solution 222 is also preferably adapted to improve the coverage uniformity, e.g., providing a uniform passivation layer 226 across the workpiece 202.

The optional leveling and wetting agent of the treatment solution 222 preferably comprises polyethylene glycol, and may alternatively comprise other chemicals, such as polypropylene glycol, or a block copolymer of propylene oxide and ethylene oxide, as examples, although other chemicals may also be used. The leveling and wetting agent of the treatment solution 222 preferably comprises a molecular weight ranging from about 400 to 20,000, for example, although alternatively, the molecular weight may comprise other values. For example, the leveling and wetting agent of the treatment solution 222 preferably comprises polyethylene glycol with molecular weight of about 1,000 to about 3,000, with a concentration of about 100 to about 300 parts per million (p.p.m.), in one embodiment. The leveling and wetting agent is preferably adapted to improve the coverage uniformity of the chemical grafting precursor of the treatment solution 222, for example.

The top surfaces 224 of the conductive features 206 and the top surfaces of the insulating layer 204 are preferably rinsed with the treatment solution 222 for about 30 seconds to 1.5 minutes at room temperature, although alternatively, other times and temperatures may also be used. A pre-cleaning step is not required in this embodiment of the invention, as described with reference to the less preferred embodiment shown in FIGS. 1 and 2. Rather, the treatment solution 222 replaces the pre-cleaning step described in the embodiment shown in FIGS. 1 and 2. The novel treatment solution 222 is also adapted to remove residue left remaining on the top surfaces of the conductive features 206 and the insulating layer 204, as well as any oxide that has formed on the top surface of the conductive features 206.

Next, a passivation layer 226 is formed over the treated conductive features 206. The passivation layer 226 preferably comprises a cobalt (Co) alloy in one embodiment. The passivation layer 226 may alternatively comprise other materials, such as a nickel (Ni) alloy. The passivation layer 226 preferably comprises Co or Ni combined with other materials, such as tungsten W, phosphorous (P), boron (B), or combinations thereof, in one embodiment. The passivation layer 226 preferably comprises Co, CoWP, CoP, CoWB, CoMoP, CoMoB, Ni, NiWP, NiP, NiB, NiMoP, or NiMoB, as examples, although the passivation layer 226 may alternatively comprise other materials. The passivation layer 226 preferably comprises about 90% or greater of Co or Ni, in one embodiment. The passivation layer 226 comprises a thickness of about 200 Angstroms or less, and preferably comprises a thickness of about 100 Angstroms, in one embodiment. The passivation layer 226 preferably comprises a conductive material.

The passivation layer 226 is preferably selectively formed on the conductive features 206, e.g., by electro-less deposition. The passivation layer 226 may be formed by introducing aqueous Co, Ni, or alloy solutions thereof into a chamber with the workpiece 202 at a temperature of about 65 to 98 degree C., at a pressure of about 1 atmosphere, in a gas environment of $N_2$, for about 2 to 10 minutes, as an example, although alternatively, the passivation layer 226 may be formed using other chemistries, temperatures, atmospheric pressures, gas environments, and other time periods.

If the conductive features 206 comprise copper, the passivation layer 226 preferably comprises Co or Ni because of the lower resistance and barrier properties of Co and Ni for copper diffusion. Furthermore, Co and Ni may be selectively formed over the conductive features 206, e.g., the passivation layer 226 preferably is formed over the conductive features 206 and not over the insulating layer 204. In addition, Co and Ni are advantageous materials to use for the passivation layer 226 because they may be electrolessly deposited. Co and Ni also provide oxidation resistance for copper, and have good adhesion to copper, for example. The passivation layer 226 may also comprise other materials exhibiting these properties, for example. The passivation layer 226 forms an alloy cap layer over the top surface of the conductive features 206, which features 206 have been treated with the novel treatment solution 222 in accordance with an embodiment of the present invention.

The passivation layer 226 thickness is substantially uniform across the entire surface of the workpiece 202 in accordance with preferred embodiments of the present invention. Preferably, all of the conductive features 206 of the workpiece 202 are coated with substantially the same thickness of the passivation layer 226. If a plurality of die is formed on the workpiece 202, preferably all of the conductive features 206 of each die are covered with substantially the same thickness of passivation layer 226, in accordance with an embodiment of the invention.

Figure 8:
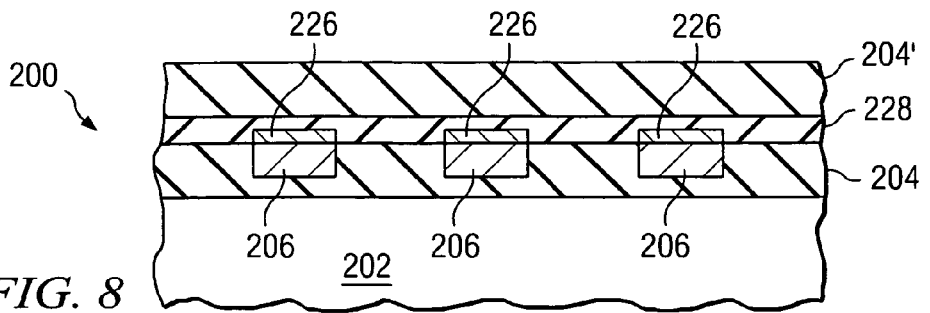
FIGS. 8 and 9 show cross-sectional views of an embodiment of the present invention, wherein a second metallization layer is formed and passivated over the metallization layer shown in FIGS. 3 through 7.

After the formation of the uniform passivation layer 226, an optional etch stop layer 228 may be formed over the passivation layer 226 and exposed portions of the insulating layer 204, as shown in FIG. 8. An etch stop layer 228 may be used if a subsequently deposited insulating layer 204' comprises a low k material, to provide an etch stop during the etch process of the insulating layer 204', for example. The etch stop layer 228 may comprise a material different than the insulating layer materials 204 and/or 204', for example. The etch stop layer 228 may comprise a material having a different etching rate than the insulating layer materials 204 and 204', for example. The etch stop layer 228 may comprise a thickness of about 800 Angstroms or less, e.g., and may comprise about 300 to about 600 Angstroms, of SiN, as examples, although alternatively, the etch stop layer 228 may comprise other materials and thicknesses.

Figure 9:
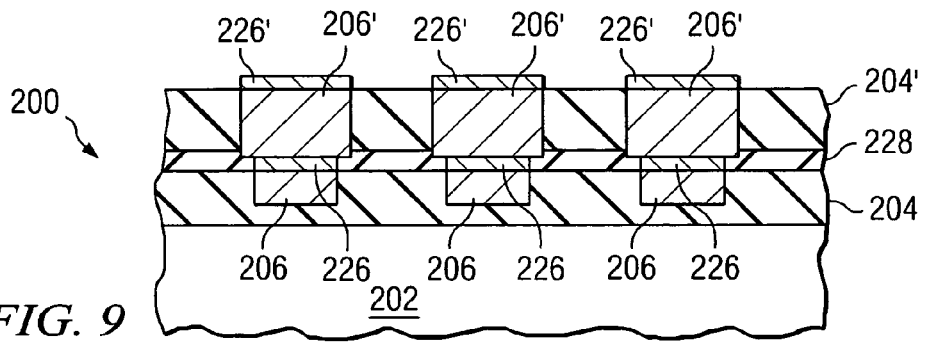

A passivation layer 226' may be selectively formed on conductive features 206' in subsequently formed metallization layers, as shown in FIG. 9, after treating the top surface of the conductive features 206' and the insulating layer 204' with the treatment solution 222, as described herein with reference to FIG. 6. A passivation layer 226 and 226' may be formed on one or more metallization layers of the semiconductor device 200, or on all of the metallization layers that include the conductive features 206 and 206' of a semiconductor device 200, for example.

Figure 10:
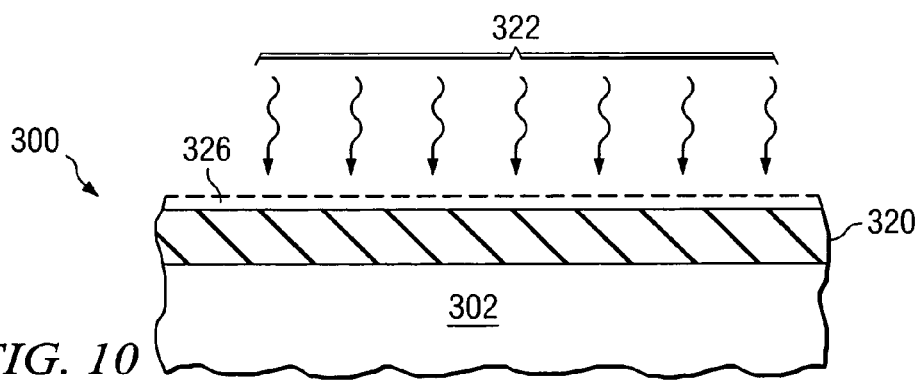
FIGS. 10 and 11 show another embodiment of the present invention, wherein the passivation layer is formed over conductive features formed in a subtractive etch process.
Figure 11:
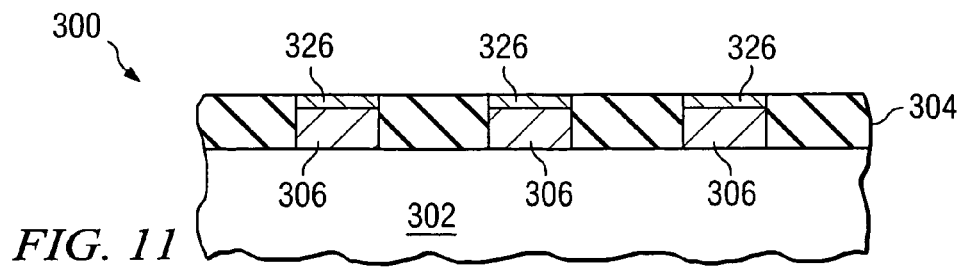

The novel treatment solution 222 may be used before forming passivation layers of damascene structures, as shown with reference to FIGS. 3 through 9, using single or dual damascene processes. Alternatively, the treatment solution 222 may also be used for semiconductor devices 300 having conductive features 306 formed in a subtractive etch process, as shown in a cross-sectional view in FIGS. 10 and 11. In this embodiment, like numerals are used for the various elements that were described in FIGS. 3 through 9, and to avoid repetition, each reference number shown in FIGS. 10 and 11 is not described again in detail herein. Rather, similar materials x02, x04, x06, etc. are preferably used for the various material layers shown as were described for FIGS. 3 through 9, where x=2 in FIGS. 3 through 9, and x=3 in FIGS. 10 and 11.

In this embodiment, a workpiece 302 is provided, and a layer of conductive material 320 is formed or deposited over the workpiece 302. The layer of conductive material 320 may optionally be treated with the treatment solution 322 at this point of the manufacturing process, and a passivation layer 326, shown in phantom, may be formed over the layer of conductive material 320. The layer of conductive material 320 and the passivation layer 326 are then patterned, e.g., using lithography techniques, to form a plurality of conductive features 306 capped with a passivation layer 326, as shown in FIG. 11. An insulating layer 304 is formed over the patterned conductive features 306 and passivation layer 326, and the insulating layer 304 is exposed to a CMP process to remove excess insulating layer 304 from over the top surface of the passivation layer 326. Note that in this embodiment, the insulating layer 304 is not treated with the treatment solution 322.

In another embodiment, the layer of conductive material 320 is not treated immediately with the treatment solution 322 after depositing the layer of conductive material 320. Rather, in this embodiment, the layer of conductive material 320 is patterned into the desired shape of the conductive lines 306 using a subtractive etch process. The insulating layer 304 is formed over the patterned conductive lines 306, and if an excess amount of the insulating layer 304 resides over the top surface of the conductive lines 306, a CMP process is used to remove the excess insulating layer 304 from over the top surface of the conductive lines 306. The top surface of the conductive lines 306 and the top surface of the insulating layer 304 are then treated with the novel treatment solution 322, and then a passivation layer 326 is selectively formed over the top surface of the treated conductive lines 306, as shown in FIG. 11. Note that in this embodiment, the passivation layer 326 may extend above the top surface of the insulating layer 304, rather than residing below the top surface of the insulating layer 304, as shown in FIG. 11.

Embodiments of the invention have useful application in any type of semiconductor device, including memory and logic devices, as examples. Embodiments of the invention are useful in semiconductor devices having a single metallization layer, or in semiconductor devices having two or more metallization layers, as examples.

Advantages of embodiments of the invention include forming uniform passivation layers 226, 226', and 326 over conductive features 206, 206', and 306 of a workpiece 202 and 302. The passivation layers 226, 226', and 326 have substantially the same thickness over and across the entire surface of the workpiece 202 and 302. The passivation layers 226, 226' and 326 have improved wetting and improved deposition uniformity. The uniform passivation layers 226, 226', and 326 may be formed before or after a CMP process, on conductive features 206, 206', or 306 formed by a damascene process (conductive features 206 or 206') or a subtractive etch process (conductive features 306). A novel treatment solution 222 and 322 is used to treat the top surface of the conductive features 206, 206', and 306 and may be used to treat the insulating layers 204, 204', and 304 surrounding the conductive features 206, 206', and 306. The treatment solution 222 and 322 improves the adhesive properties of the conductive features 206, 206', and 306 and provides improved selectivity between the conductive features 206, 206', and 306 and the insulating layers 204, 204', and 304 during the formation of the passivation layers 226, 226', and 326. Embodiments of the invention are readily implementable into existing manufacturing process flows, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of treating a semiconductor device having at least one conductive feature formed thereon, before forming a passivation layer over the at least one conductive feature, the method comprising:
   treating in a single step a top surface of the at least one conductive feature disposed on a semiconductor substrate of the semiconductor device with a treatment solution, the treatment solution comprising a cleaning solution and a chemical grafting precursor.

2. The method according to claim 1, wherein the cleaning solution of the treatment solution comprises $H_2SO_4$ or citric acid.

3. The method according to claim 2, wherein the cleaning solution of the treatment solution comprises about 0.01 to 0.1% in weight of acid.

4. The method according to claim 1, wherein the chemical grafting precursor of the treatment solution comprises vinyl pyridine, phenyldiazonium salts, aryl bromides, or alkylenes.

5. The method according to claim 1, wherein the treatment solution further comprises a leveling and wetting agent.

6. The method according to claim 5, wherein the leveling and wetting agent of the treatment solution comprises polyethylene glycol, polypropylene glycol, or a block copolymer of propylene oxide and ethylene oxide, and wherein the leveling and wetting agent of the treatment solution comprises a molecular weight ranging from about 400 to 20,000.

7. The method according to claim 5, wherein the leveling and wetting agent of the treatment solution comprises polyethylene glycol with molecular weight of about 1,000 to about 3,000, and a concentration of about 100 to about 300 parts per million (p.p.m.).

8. The method according to claim 1, wherein the at least one conductive feature is disposed within an insulating layer, wherein treating the top surface of the at least one conductive feature with a treatment solution further comprises treating a top surface of the insulating layer.

9. The method according to claim 8, wherein the passivation layer is selectively formed over the at least one conductive feature with respect to the insulating layer, wherein treating the top surface of the insulating layer with the treatment solution increases the selectivity of the passivation layer formation and adhesion of the passivation layer to the at least one conductive feature.

10. A method of manufacturing a semiconductor device, the method comprising:
   providing a workpiece comprising a semiconductor substrate;
   forming at least one conductive feature over the workpiece;
   treating at least a top surface of the at least one conductive feature with a treatment solution in a single step, the treatment solution comprising a cleaning solution and a chemical grafting precursor; and
   forming a passivation layer over the at least one conductive feature.

11. The method according to claim 10, wherein the cleaning solution of the treatment solution comprises $H_2SO_4$ or citric acid.

12. The method according to claim 11, wherein the cleaning solution of the treatment solution comprises about 0.01 to 0.1% in weight of acid.

13. The method according to claim 11, wherein the cleaning solution of the treatment solution further comprises $H_2O$, ethanol, or acetone.

14. The method according to claim 10, wherein the chemical grafting precursor of the treatment solution comprises vinyl pyridine, phenyldiazonium salts, aryl bromides, or alkylenes.

15. The method according to claim 10, wherein the treatment solution further comprises a leveling and wetting agent.

16. The method according to claim 15, wherein the leveling and wetting agent of the treatment solution comprises polyethylene glycol, polypropylene glycol, or a block copolymer of propylene oxide and ethylene oxide, and wherein the leveling and wetting agent of the treatment solution comprises a molecular weight ranging from about 400 to about 20,000.

17. The method according to claim 15, wherein the leveling and wetting agent of the treatment solution comprises polyethylene glycol with a molecular weight of about 1,000 to about 3,000 and a concentration of about 100 to about 300 parts per million (p.p.m.).

18. The method according to claim 10, wherein forming the at least one conductive feature comprises disposing the at least one conductive feature within an insulating layer, wherein treating at least the top surface of the at least one conductive feature with a treatment solution further comprises treating a top surface of the insulating layer.

19. The method according to claim 18, wherein forming the passivation layer comprises selectively forming the passivation layer over the at least one conductive feature with respect to the insulating layer, wherein treating the top surface of the insulating layer with the treatment solution increases the selectivity of forming the passivation layer.

20. The method according to claim 18, wherein forming the at least one conductive feature comprises depositing a conductive material over the workpiece, patterning the conductive material to form the at least one conductive feature, depositing the insulating layer over the at least one conductive feature, and removing the insulating layer from over a top surface of the at least one conductive feature.

21. The method according to claim 18, wherein forming the at least one conductive feature comprises depositing the insulating layer over the workpiece, patterning the insulating layer, depositing a conductive material over the patterned insulating layer, filling the patterned insulating layer, and removing the conductive material from over a top surface of the insulating layer, leaving at least one conductive feature formed in the insulating layer.

22. The method according to claim 18, wherein disposing the at least one conductive feature within the insulating layer comprises disposing the at least one conductive feature in an insulating layer comprising about 5,000 Angstroms or less of $SiO_2$, SiON, or fluorinated silicon glass (FSG).

23. The method according to claim 10, wherein forming the at least one conductive feature comprises forming pure copper, a copper alloy, aluminum, an aluminum alloy, tungsten, or a tungsten alloy.

24. The method according to claim 10, wherein forming the passivation layer comprises forming about 200 Angstroms or less of Co, CoWP, CoP, CoWB, CoMoP, CoMoB, Ni, NiWP, NiP, NiB, NiMoP, or NiMoB.

25. The method according to claim 10, wherein forming the at least one conductive feature comprises forming at least one first conductive feature, further comprising forming a second conductive feature over the at least one first conductive feature, treating the at least a top surface of the at least one second conductive feature with the treatment solution, and forming a passivation layer over the at least one second conductive feature.

26. The method according to claim 25, further comprising forming an etch stop layer over the at least one first conductive feature, and forming an insulating layer over the etch stop layer, before forming the at least one second conductive feature.

27. The method according to claim 10, wherein forming the passivation layer comprises electro-less deposition.

28. The method according to claim 10, wherein forming the passivation layer comprises introducing aqueous Co, Ni, or alloy solutions thereof into a chamber with the workpiece at a temperature of about 65 to 98 degree C., at a pressure of about 1 atmosphere, in a gas environment of $N_2$, for about 2 to 10 minutes.

29. The method according to claim 10, wherein forming the at least one conductive feature comprises forming a plurality of conductive features, the conductive features comprising conductive lines or vias, wherein forming the passivation layer over the plurality of conductive features comprises forming the passivation layer having substantially the same thickness over each of the plurality of conductive features.

30. A semiconductor device manufactured in accordance with the method of claim 29.

* * * * *